(12) United States Patent
Ichikawa

(10) Patent No.: US 6,326,659 B1
(45) Date of Patent: Dec. 4, 2001

(54) SEMICONDUCTOR MEMORY AND METHOD OF MANUFACTURING SAME

(75) Inventor: Takashi Ichikawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/476,782

(22) Filed: Dec. 30, 1999

(30) Foreign Application Priority Data

Jul. 27, 1999 (JP) .................................................. 11-211799

(51) Int. Cl.$^7$ ................................................ H01L 27/108
(52) U.S. Cl. ........................ 257/306; 257/296; 257/288
(58) Field of Search ..................................... 257/296, 297, 257/298, 300, 303, 305, 310, 311, 306; 365/149

(56) References Cited

U.S. PATENT DOCUMENTS

| | | |
|---|---|---|
| 5,383,151 * | 1/1995 | Onishi et al. . |
| 5,764,562 * | 6/1998 | Hamamoto .......................... 365/149 |
| 6,088,282 * | 6/2000 | Loughmiller et al. ............ 365/225.7 |
| 6,121,083 * | 9/2000 | Matsuki .................................. 438/254 |
| 6,141,270 * | 10/2000 | Casper ................................... 365/201 |
| 6,147,376 * | 9/2000 | Hofman et al. . |
| 6,150,689 * | 11/2000 | Narui et al. .......................... 257/306 |

FOREIGN PATENT DOCUMENTS 61-77193    4/1986   (JP) .

* cited by examiner

Primary Examiner—Nathan Flynn
Assistant Examiner—Kevin Quinto
(74) Attorney, Agent, or Firm—Oblon, Spivak, McClelland, Maier & Neustadt, P.C.

(57) ABSTRACT

A semiconductor memory includes a storage node (14), a capacitor dielectric film (15) selectively formed on the storage node (14), and a bit line cum cell plate (16) formed over a semiconductor substrate (10) including the capacitor dielectric film (15) on a bit line by bit line basis. Part of the bit line cum cell plate (16) is formed directly on a source/drain region (27), and a region in which the bit line cum cell plate 16 contacts the source/drain region (27) serves as a bit line contact. The bit line cum cell plate (16) is such that a bit line and a cell plate of a memory cell capacitor are integrally formed from a single interconnect layer. The semiconductor memory has a structure which achieves reduction in manufacturing costs. A method of manufacturing such a semiconductor memory is also provided.

5 Claims, 8 Drawing Sheets

F I G . 3
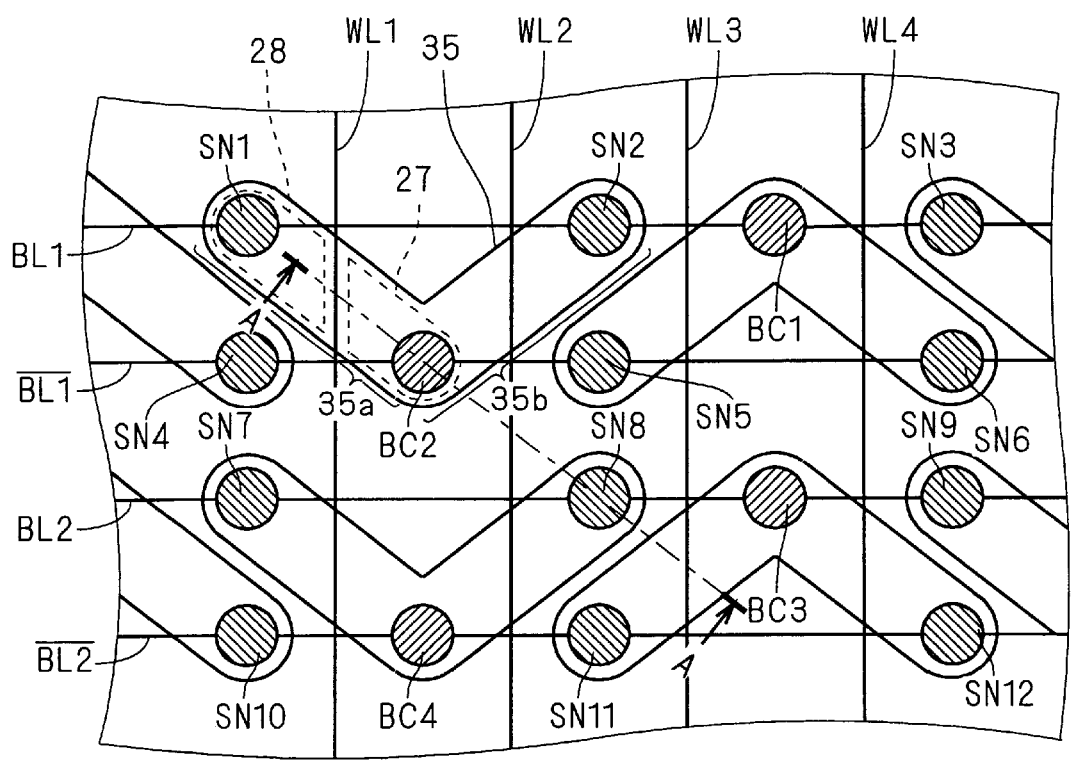

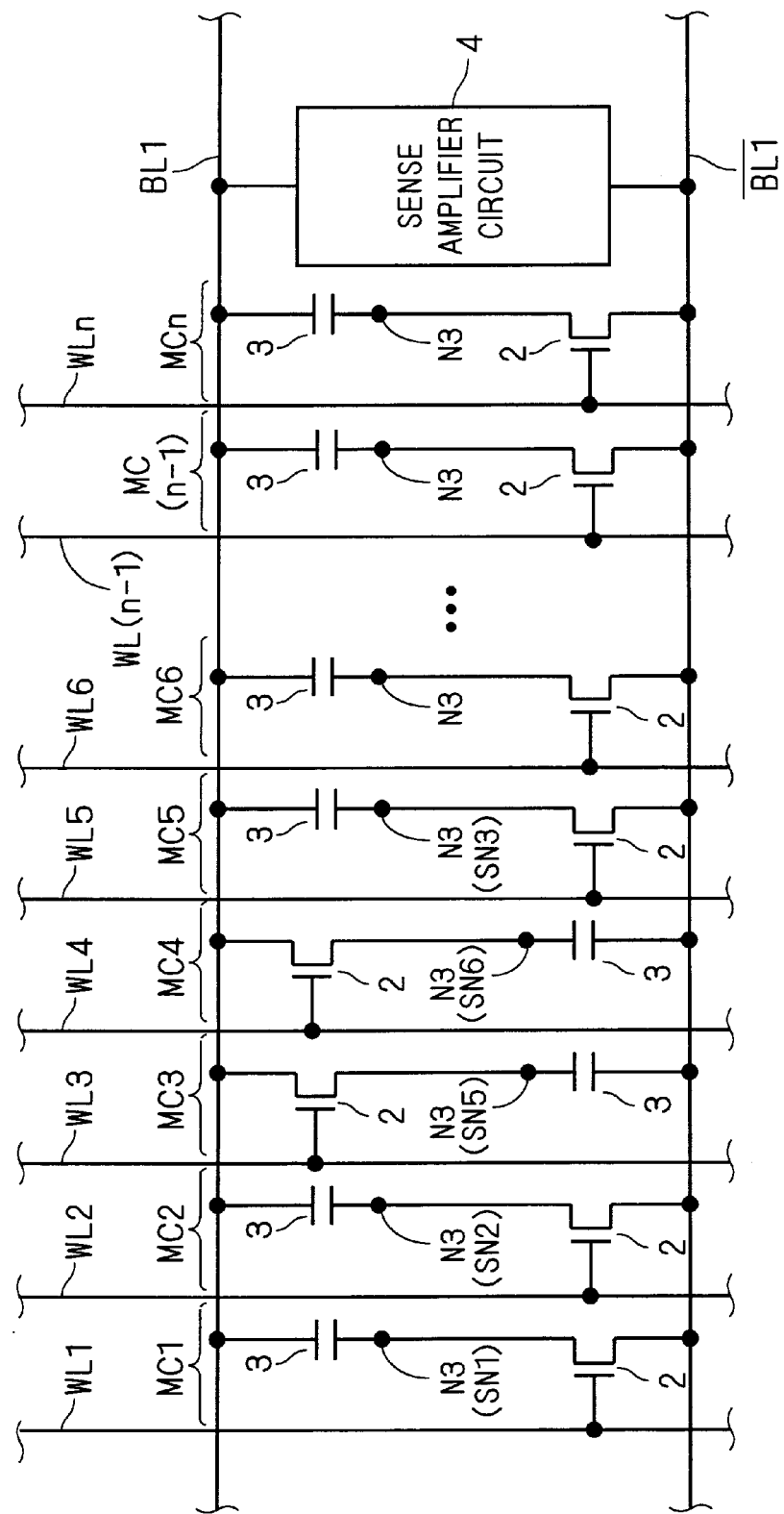
F I G . 4

SEMICONDUCTOR MEMORY AND METHOD OF MANUFACTURING SAME

BACKGROUND OF THE INVENTION

1. Field of the Invention

The present invention relates to a memory cell structure of a semiconductor memory such as a DRAM.

2. Description of the Background Art

FIG. 7 is a circuit diagram showing a memory cell structure of a background art DRAM. As shown in FIG. 7, a memory cell 1 comprises a memory transistor 2 that is an NMOS transistor, and a memory cell capacitor 3. The memory transistor 2 has a gate connected to a word line WL, a drain (source) connected to a bit line BL, and a source (drain) connected to a storage node serving as a first electrode of the memory cell capacitor 3. A fixed potential Vcp is applied to a cell plate serving as a second electrode of the memory cell capacitor 3.

A sense amplifier circuit 4 is provided between a pair of bit lines BL and $\overline{BL}$. In a read operation, the sense amplifier circuit 4 detects and amplifies a potential difference between the pair of bit lines BL and $\overline{BL}$.

FIG. 8 is a cross-sectional view of a memory cell region of the background art DRAM. FIG. 9 is a plan view of the memory cell region of the background art DRAM. The cross section of FIG. 8 is taken along the line B—B of FIG. 9.

As illustrated in FIGS. 8 and 9, MOS transistors 30 each including a gate electrode 11, a gate oxide film 12, sidewalls 13, a first source/drain region 27, a second source/drain region and a channel region are formed on a semiconductor substrate 10. Each of the MOS transistors 30 corresponds to the memory transistor 2 of FIG. 7. As shown in FIG. 9, the gate electrode 11 extending linearly is selectively formed, and functions also as the word line WL of FIG. 7.

The source/drain regions are formed in a diffusion region 50. Specifically, the first source/drain region 27 is formed in part of the diffusion region 50 which lies on one side of the gate electrode 11, and the second source/drain region not shown in FIG. 8 is formed in part of the diffusion region 50 which lies on the other side of the gate electrode 11. The term "source/drain" is used herein because this electrode sometimes functions as a source of carriers and sometimes functions to drain carriers to the outside, depending on whether information is read or written.

An interlayer insulation film 18 covers the MOS transistors 30, and a storage node 14 is formed on the interlayer insulation film 18 and the second source/drain region. As illustrated in FIG. 9, a region in which the storage node 14 contacts the second source/drain region serves as a storage node contact 52.

A capacitor dielectric film 15 is formed on the storage node 14. A cell plate 32 is formed over the entire surface of the semiconductor substrate 10 including the capacitor dielectric film 15 except on a region adjacent the surface of the first source/drain region 27.

An interlayer insulation film 21 is formed over the entire surface of the semiconductor substrate 10 including the cell plate 32. A bit line 33 extending linearly as shown in FIG. 9 is selectively formed on the interlayer insulation film 21. Part of the bit line 33 extends through the interlayer insulation film 21 and is formed directly on the first source/drain region 27. A region in which the bit line 33 contacts the first source/drain region 27 serves as a bit line contact 51. The bit line 33 corresponds to the bit line BL of FIG. 7.

An interlayer insulation film 22 is formed on the bit line 33, and an interlayer insulation film 23 is formed on the interlayer insulation film 22. A first aluminum interconnect line 31 for setting the potential of the gate electrode 11 (word line WL) is formed in the interlayer insulation film 23. An interlayer insulation film 24 is formed on the interlayer insulation film 23. A second aluminum interconnect line (not shown) is formed in the interlayer insulation film 24.

With such an arrangement, the read operation is performed in a manner described below. After the pair of bit lines BL and $\overline{BL}$ are precharged to the same potential (e.g., about one-half of a power supply voltage Vcc), the memory transistor 2 is turned on to electrically connect the memory cell capacitor 3 to the bit line BL. The potential of the bit line BL is increased or decreased based on the electric charge stored on the memory cell capacitor 3. The sense amplifier circuit 4 detects and amplifies the potential difference between the pair of bit lines BL and $\overline{BL}$.

FIGS. 10 through 12 are cross-sectional views showing a background art method of manufacturing a memory cell of the DRAM shown in FIGS. 7 through 9.

With reference to FIG. 10, the MOS transistor 30 is selectively formed on the semiconductor substrate 10, and thereafter the interlayer insulation film 18 covers the upper surface of the gate electrode 11 of the MOS transistor 30. Then, the storage node 14 is selectively formed.

Next, as illustrated in FIG. 11, a nitride film is deposited and oxidized to form an oxynitride film which in turn is patterned to form the capacitor dielectric film 15. Doped polysilicon is deposited over the entire surface of the resultant structure and is then patterned (using a photolithographic technique or the like) so as to expose the surface of the first source/drain region 27, to form the cell plate 32.

With reference to FIG. 12, a high-temperature oxide film is deposited over the entire surface of the resultant structure and is then patterned (using a photolithographic technique or the like) so as to expose the surface of the first source/drain region 27, to form the interlayer insulation film 21. Thereafter, polysilicon is deposited over the entire surface of the resultant structure, and tungsten silicide (WSi) is formed on the polysilicon by a sputtering process. The polysilicon and tungsten silicide are patterned to form the bit line 33 directly connected to the first source/drain region 27.

Subsequently, an existing method is used to form the interlayer insulation films 22 to 24 and the first aluminum interconnect line 31. Thus, the structure shown in FIG. 8 is provided.

The manufacture of the background art DRAM constructed as above described requires at least four steps of wiring on the semiconductor substrate, i.e., the steps of forming the gate electrode (word line) of the MOS transistor, forming the storage node of the memory cell capacitor, forming the cell plate of the memory cell capacitor, and forming the bit line. This results in manufacturing costs higher than necessary.

SUMMARY OF THE INVENTION

According to a first aspect of the present invention, a semiconductor memory comprises: a pair of bit lines; and a memory cell between the pair of bit lines, the memory cell comprising a memory cell capacitor having a first electrode and a second electrode, and a memory transistor having a first electrode connected to one of the pair of bit lines, a second electrode connected to the second electrode of the memory cell capacitor, and a control electrode connected to a select line, wherein the first electrode of the memory cell capacitor and the other of the pair of bit lines are integrally formed from a single interconnect layer.

Preferably, according to a second aspect of the present invention, in the semiconductor memory of the first aspect, the memory cell includes a plurality of memory cells formed in a region lying between the pair of bit lines, and the select line includes a plurality of select lines corresponding to the plurality of memory cells, respectively. The semiconductor memory further comprises a sense amplifier circuit connected to the pair of bit lines for detecting and amplifying a potential difference between the pair of bit lines in a read operation.

Preferably, according to a third aspect of the present invention, in the semiconductor memory of the first aspect, the select line includes a first select line and a second select line; the memory cell includes a first memory cell and a second memory cell; a first memory transistor serving as the memory transistor of the first memory cell has a control electrode connected to the first select line, and a second memory transistor serving as the memory transistor of the second memory cell has a control electrode connected to the second select line; and the first and second memory transistors have respective first electrodes connected commonly to the one of the pair of bit lines through a single bit line contact.

According to a fourth aspect of the present invention, a method of manufacturing a semiconductor memory comprises the steps of: (a) forming a memory transistor on a surface of a semiconductor substrate, the memory transistor having a first electrode, a second electrode and a control electrode; (b) forming a first conductive layer on the semiconductor substrate, the first conductive layer being independent of the control electrode and the first electrode of the memory transistor, the first conductive layer being electrically connected to the second electrode of the memory transistor; and (c) forming a second conductive layer over the first conductive layer, with an insulation film between the first conductive layer and the second conductive layer, wherein the second conductive layer and a bit line are integrally formed from a single interconnect layer, and wherein the second conductive layer, the second conductive layer and the insulation film constitute a memory cell capacitor.

As described above, the first electrode of the memory cell capacitor of the semiconductor memory according to the first aspect of the present invention is formed integrally with the other of the pair of bit lines from the single interconnect layer. The bit line and the first electrode of the memory cell capacitor are formed in the single step of wiring (forming a conductive layer). This reduces the number of wiring steps to consequently achieve reduction in manufacturing costs.

The semiconductor memory according to the second aspect of the present invention comprises the plurality of memory cells all of which are formed between the pair of bit lines. The memory cell capacitor of each of the memory cells has the first electrode functioning as the other bit line and the second electrode connected to the one of the bit lines through the memory transistor.

Therefore, when the read operation is performed in such a manner that the pair of bit lines are set at the same potential and thereafter one select line turns on the memory transistor of one memory cell to electrically connect the second electrode of the memory cell capacitor of the one memory cell to the one of the bit lines, there arises a potential difference reflecting the contents stored on the selected memory cell capacitor between the pair of bit lines.

In the read operation, the memory transistors of non-selected memory cells are all off and the memory cell capacitors thereof are floating. Thus, the non-selected memory cells do not affect the potentials of the pair of bit lines. Therefore, the sense amplifier circuit amplifies the potential difference between the pair of bit lines, whereby the read operation is performed without problems.

In the semiconductor memory according to the third aspect of the present invention, the first and second memory transistors have the respective first electrodes connected commonly to the one of the bit lines through the single bit line contact. This increases the degree of integration.

In the method according to the fourth aspect of the present invention, the second conductive layer formed in the step (c) is formed integrally with the bit line from the single interconnect line and, in conjunction with the first conductive layer and the insulation film, constitutes the memory cell capacitor. Thus, the second conductive layer has the functions both as the first electrode of the memory cell capacitor and as the bit line.

The bit line and the first electrode o the memory cell capacitor are formed in the single step (c) of wiring. This achieves reduction in the number of wiring steps.

It is therefore an object of the present invention to provide a semiconductor memory having a structure which achieves reduction in manufacturing costs, and a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 3 is a plan view of the memory cell region of the DRAM according to the preferred embodiment;

FIG. 4 is a circuit diagram showing a plurality of memory cell structures formed between a pair of bit lines;

DESCRIPTION OF THE PREFERRED EMBODIMENTS

Figure 1:
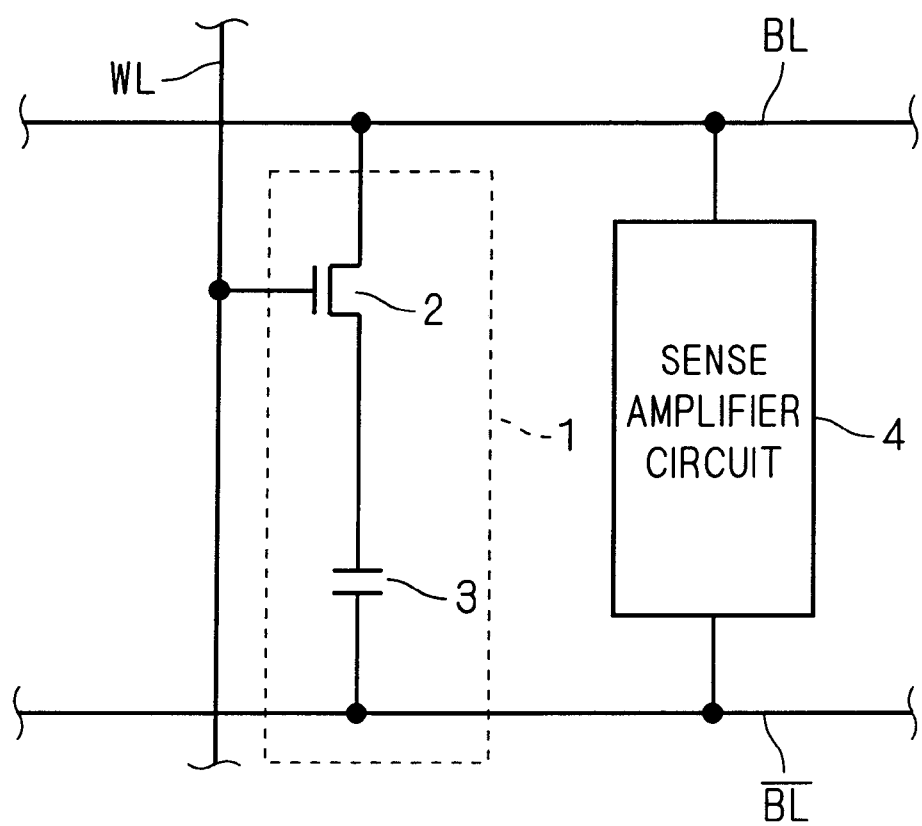
FIG. 1 is a circuit diagram showing a memory cell structure of a DRAM according to a preferred embodiment of the present invention.

FIG. 1 is a circuit diagram showing a memory cell structure of a DRAM according to a preferred embodiment of the present invention. As shown in FIG. 1, a memory cell 1 comprises a memory transistor 2 that is an NMOS transistor, and a memory cell capacitor 3. The memory transistor 2 has a gate connected to a word line WL, a drain (source) connected to a bit line BL, and a source (drain) connected to a storage node serving as a first electrode of the memory cell capacitor 3. A cell plate serving as a second electrode of the memory cell capacitor 3 and an inverted bit line $\overline{BL}$ are integrally formed from a single interconnect layer.

A sense amplifier circuit 4 is provided between the pair of bit lines BL and $\overline{BL}$. In a read operation, the sense amplifier circuit 4 detects and amplifies a potential difference between the pair of bit lines BL and $\overline{BL}$.

Figure 2:
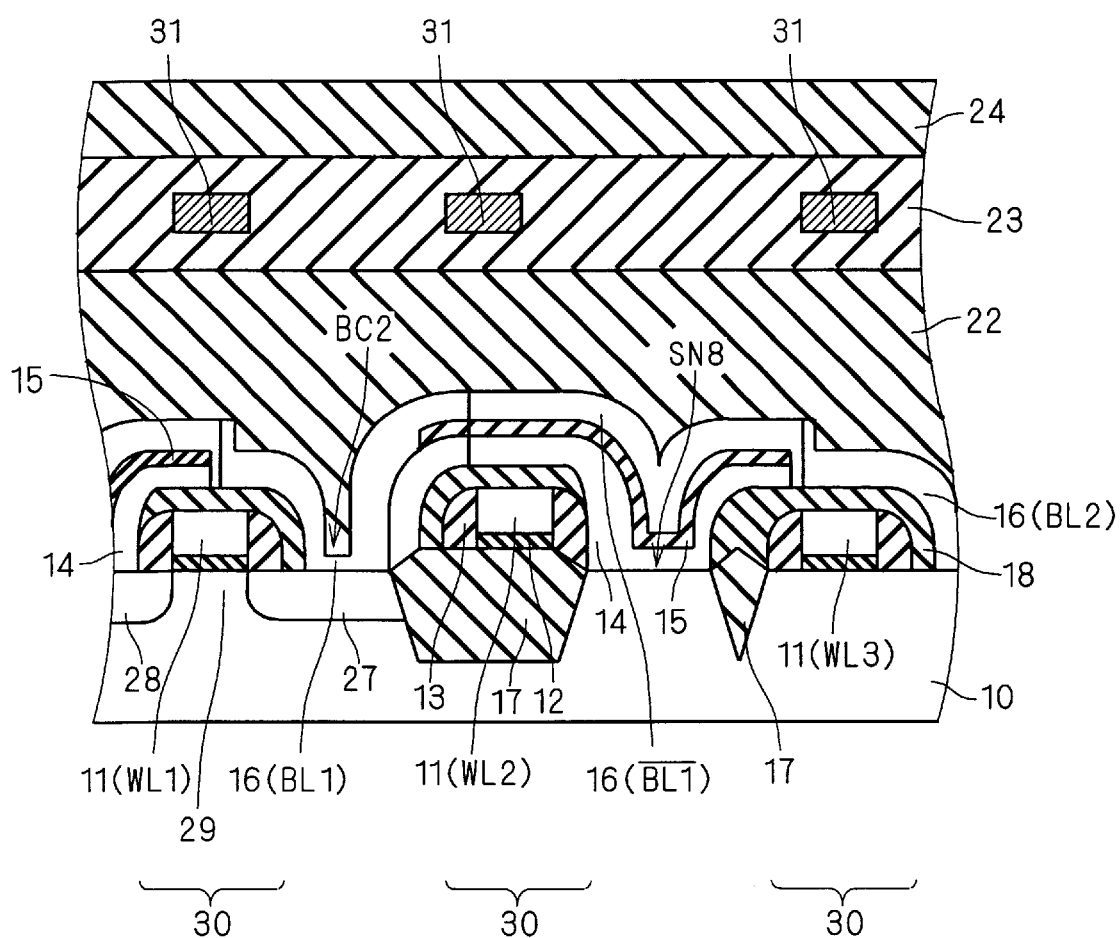
FIG. 2 is a cross-sectional view of a memory cell region of the DRAM according to the preferred embodiment.

FIG. 2 is a cross-sectional view of a memory cell region of the DRAM according to the preferred embodiment. FIG. 3 is a schematic plan view of the memory cell region of the DRAM according to the preferred embodiment. The cross section of FIG. 2 is taken along the line A—A of FIG. 3.

As illustrated in FIGS. 2 and 3, MOS transistors 30 each including a gate electrode 11, a gate oxide film 12, sidewalls 13, a first source/drain region 27, a second source/drain region 28 and a channel region 29 are formed on a semiconductor substrate 10. Each of the MOS transistors 30 corresponds to the memory transistor 2 of FIG. 1. As shown in FIG. 3, the gate electrode 11 extending linearly is selectively formed, and functions also as the word line WL of FIG. 1. In other words, the gate electrode of the memory transistor 2 and the word line WL are integrally formed from a single interconnect layer.

As illustrated in FIG. 3, the first and second source/drain regions 27 and 28 are formed in a diffusion region 35. Specifically, the first source/drain region 27 is formed in part of the diffusion region 35 which lies on one side of the gate electrode 11 functioning also as the word line WL (WL1 to WL4), and the second source/drain region 28 is formed in part of the diffusion region 35 which lies on the other side of the gate electrode 11.

An interlayer insulation film 18 covers the MOS transistors 30, and a storage node 14 is formed on the interlayer insulation film 18 and the second source/drain region 28. As illustrated in FIG. 3, a region in which the storage node 14 contacts the second source/drain region 28 serves as a storage node contact SN (SN1 to SN12).

A capacitor dielectric film 15 is selectively formed on the storage node 14. A bit line cum cell plate 16 extending linearly is formed over the semiconductor substrate 10 including the capacitor dielectric film 15 on a bit line by bit line basis. Part of the bit line cum cell plate 16 is formed directly on the first source/drain region 27. A region in which the bit line cum cell plate 16 contacts the first source/drain region 27 serves as a bit line contact BC (BC1 to BC4). The bit line BL and the cell plate of the memory cell capacitor 3 are integrally formed from the bit line cum cell plate 16, i.e., the same interconnect layer. The bit line cum cell plate 16 corresponds to the bit line BL and the cell plate of the memory cell capacitor 3 shown in FIG. 1.

An interlayer insulation film 22 is formed on the bit line cum cell plate 16, and an interlayer insulation film 23 is formed on the interlayer insulation film 22. A first aluminum interconnect line 31 for setting the potential of the gate electrode 11 (word line WL) is formed in the interlayer insulation film 23. An interlayer insulation film 24 is formed on the interlayer insulation film 23. A second aluminum interconnect line (not shown) is formed in the interlayer insulation film 24.

A plan configuration of the diffusion regions 35 will be described in detail. As illustrated in FIG. 3, the diffusion regions 35 are of V-shaped (including inverted V-shape) and are formed between the pair of bit lines BL and $\overline{BL}$ (BL1 and $\overline{BL1}$; BL2 and $\overline{BL2}$). For example, attention will be focused on a diffusion region 35 having storage node contacts SN1, SN2 and a bit line contact BC2. This diffusion region 35 includes a first region 35a extending downwardly to the right in plan view of FIG. 3 from the bit line BL1 to the inverted bit line $\overline{BL1}$ across a word line WL1, and a second region 35b extending upwardly to the right in plan view of FIG. 3 from the inverted bit line $\overline{BL1}$ to the bit line BL1 across a word line WL2.

The storage node contact SN1 is provided in a region wherein the first region 35a of the diffusion region 35 and the bit line BL1 (bit line cum cell plate 16) overlap each other in plan view. The bit line contact BC2 is provided in a region wherein the first region 35a and the second region 35b overlap each other in plan view. The storage node contact SN2 is provided in a region wherein the second region 35b of the diffusion region 35 and the bit line BL1 overlap each other in plan view.

Thus, the single bit line contact electrically connects the two source/drain regions (the source/drain region in the first region 35a and the source/drain region in the second region 35b) to the associated bit line. This increases the degree of integration.

FIG. 4 is a circuit diagram showing a plurality of memory cell structures formed between a pair of bit lines. As shown in FIG. 4, n memory cells MC1 to MCn are provided between the pair of bit lines BL1 and $\overline{BL1}$. Each of the memory cells MC1 to MCn, similar to the memory cell 1 of FIG. 1, comprises the memory transistor 2 and the memory cell capacitor 3.

The memory cells MC1, MC2, MC5, MC6 are designed such that the memory cell capacitor 3 is provided closer to the bit line BL1 and the memory transistor 2 is provided closer to the inverted bit line $\overline{BL1}$. More specifically, the memory transistor 2 has a drain (source) connected to the inverted bit line $\overline{BL1}$, a gate connected to its associated word line WL (WL1, WL2, WL5, WL6), and a source (drain) connected to a storage node N3 of the memory cell capacitor 3. The cell plate of the memory cell capacitor 3 and the bit line BL1 are electrically connected to each other (or integrally formed from a single interconnect layer).

The memory cells MC3, MC4, on the other hand, are designed such that the memory transistor 2 is provided closer to the bit line BL1 and the memory cell capacitor 3 is provided closer to the inverted bit line $\overline{BL1}$. More specifically, the memory transistor 2 has a drain (source) connected to the bit line BL1, a gate connected to its associated word line WL (WL3, WL4), and a source (drain) connected to the storage node N3 of the memory cell capacitor 3. The cell plate of the memory cell capacitor 3 and the inverted bit line $\overline{BL1}$ are electrically connected to each other (or integrally formed from a single interconnect layer).

A comparison is made between FIGS. 3 and 4. The storage node N3 of the memory cell capacitor 3 of the memory cell MC1 of FIG. 4 corresponds to the storage node contact SN1 of FIG. 3. Similarly, the storage nodes N3 of the memory cell capacitors 3 of the memory cells MC2, MC3, MC4, MC5 of FIG. 4 correspond to the storage node contacts SN2, SN5, SN6, SN3 of FIG. 3, respectively.

Description is given hereinafter on the read operation of the DRAM of the preferred embodiment when the memory cell MC3 of FIG. 4 is read. Initially, it is assumed that the pair of bit lines BL1 and $\overline{BL1}$ are precharged to the same potential (e.g., Vcc (power supply voltage)/2). At this time, since all of the word lines WL are low and all of the memory transistors 2 are off, all of the memory cell capacitors 3 are floating and are not influenced.

Thereafter, the word line WL3 is selectively driven high to turn on the memory transistor 2 of the memory cell MC3, electrically connecting the memory cell capacitor 3 of the memory cell MC3 to the bit line BL1. The sense amplifier circuit 4 detects and amplifies a potential difference between the pair of bit lines BL1 and $\overline{BL1}$ developed by the increase or decrease in the potential of the bit line BL1 based on the electric charge stored on the memory cell capacitor 3 of the memory cell MC3, to perform the read operation.

In the read operation, when the memory cell capacitor 3 of the memory cell MC3 stores information indicative of "1" (a state in which the storage node potential is higher than the potential of the pair of bit lines BL1 and $\overline{BL1}$ precharged), the memory cell capacitor 3 of the memory cell MC3 increases the potential of the bit line BL1. The sense amplifier circuit 4 detects the potential difference between the pair of bit lines BL1 and $\overline{BL1}$, and amplifies the potential of the bit line BL1 up to the power supply voltage Vcc and the potential of the inverted bit line $\overline{BL1}$ down to a ground potential GND. On the other hand, when the memory cell capacitor 3 of the memory cell MC3 stores information indicative of "0" (a state in which the storage node potential is lower than the potential of the pair of bit lines BL1 and $\overline{BL1}$ precharged), the memory cell capacitor 3 of the memory cell MC3 decreases the potential of the bit line BL1. The sense amplifier circuit 4 detects the potential difference between the pair of bit lines BL1 and $\overline{BL1}$, and amplifies the potential of the bit line BL1 down to the ground potential GND and the potential of the inverted bit line $\overline{BL1}$ up to the power supply voltage Vcc.

Assuming that a potential close to the power supply voltage Vcc is a logically high level and a potential close to the ground potential GND is a logically low level, the storage node N3 of the memory cell capacitor 3 of the memory cell MC3 and the inverted bit line $\overline{BL1}$ are constantly held in logically opposite relationship with each other during the amplification by the sense amplifier circuit 4 in the read operation. This accomplishes the read operation without problems. Other memory cells MC1, MC2, and MC4 to MCn between the pair of bit lines BL1 and $\overline{BL1}$ are not affected since the word lines WL associated therewith are low and the memory cell capacitors 3 thereof are floating.

In a write operation, the potential of one of the pair of bit lines BL1 and $\overline{BL1}$ is set at the power supply voltage Vcc and the potential of the other is set at the ground potential GND. The write operation is performed only on the memory cell capacitor 3 of a selected memory cell MC associated with one of the word lines WL which is driven high. The memory cells other than the selected memory cell MC are not affected since the word lines WL associated therewith are low.

Figure 5:
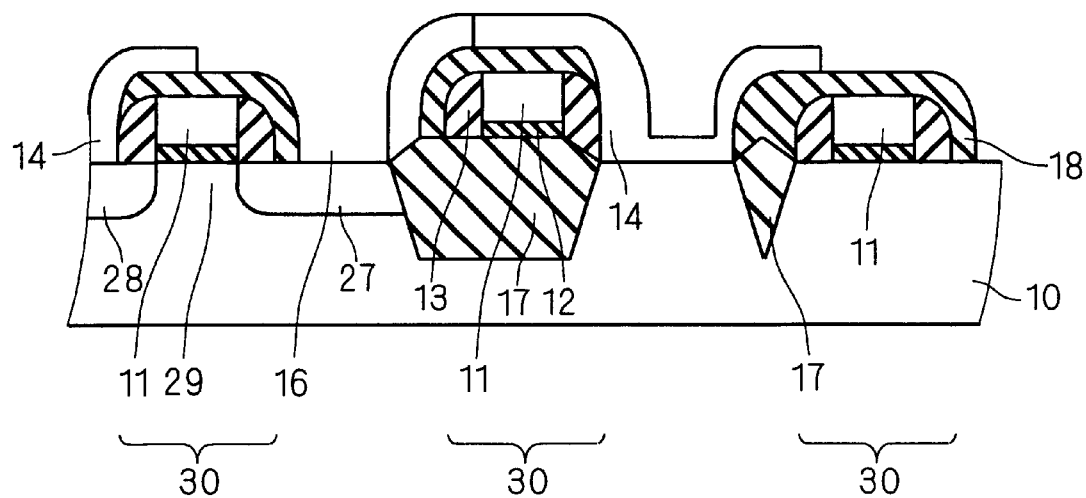
FIGS. 5 and 6 are cross-sectional views showing a method of manufacturing memory cells of the DRAM according to the preferred embodiment.
Figure 6:
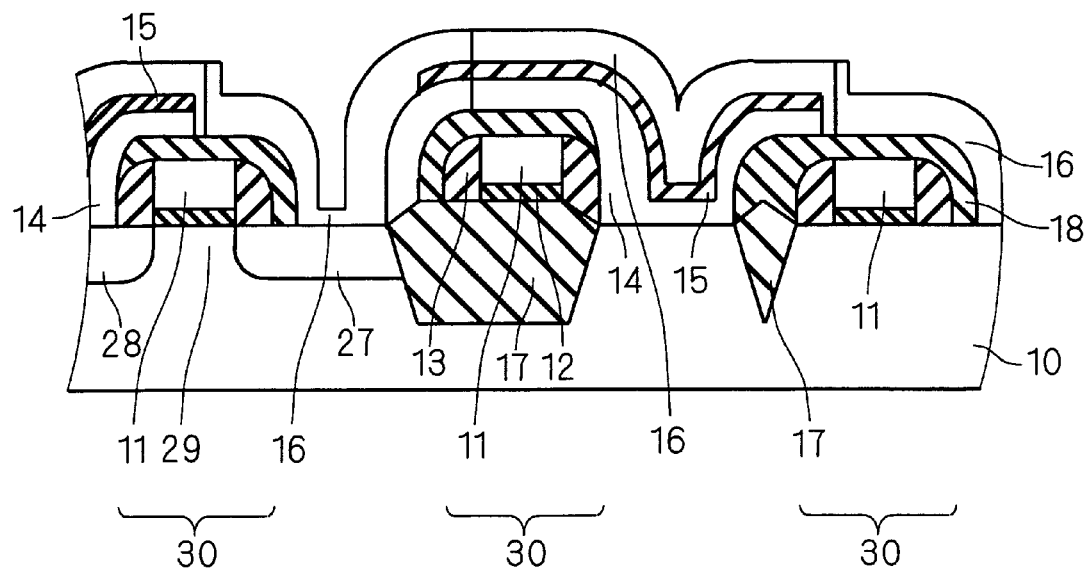
Figure 7:
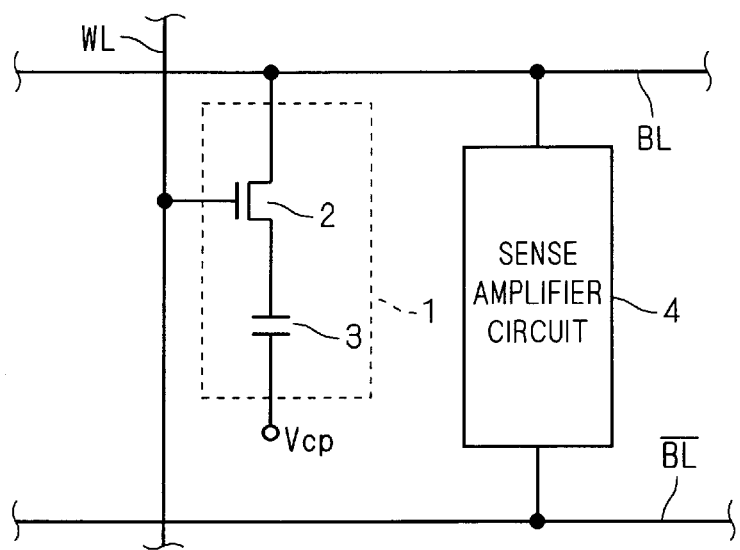
FIG. 7 is a circuit diagram showing a memory cell structure of a background art DRAM.
Figure 8:
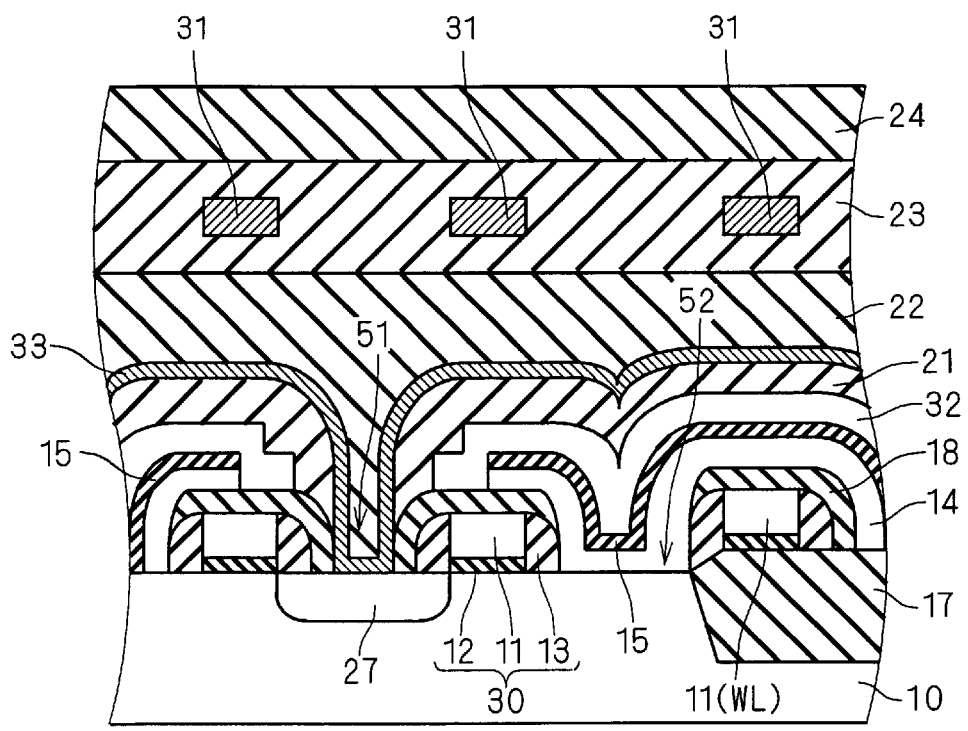
FIG. 8 is a cross-sectional view of a memory cell region of the background art DRAM.
Figure 9:
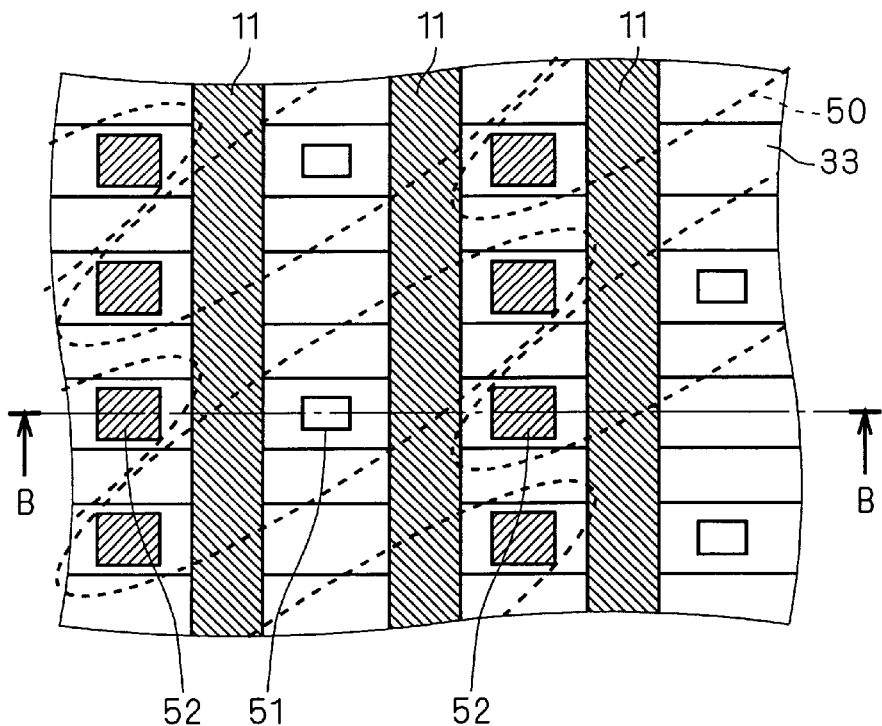
FIG. 9 is a plan view of the memory cell region of the background art DRAM.
Figure 10:
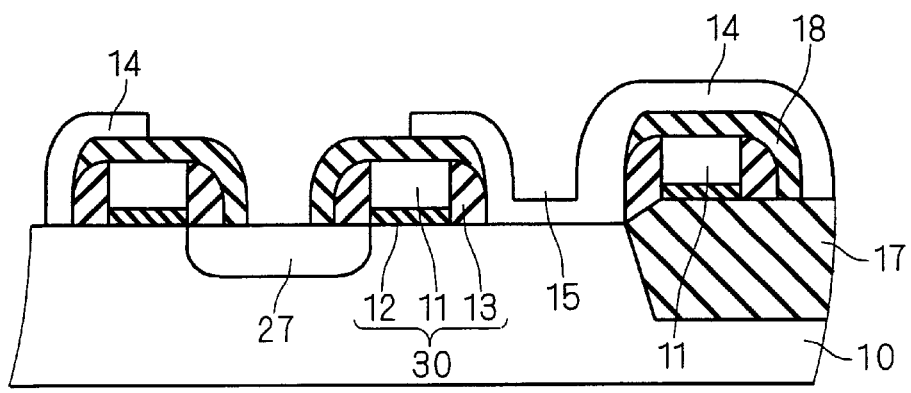
FIGS. 10 through 12 are cross-sectional views showing a method of manufacturing the background art DRAM.
Figure 11:
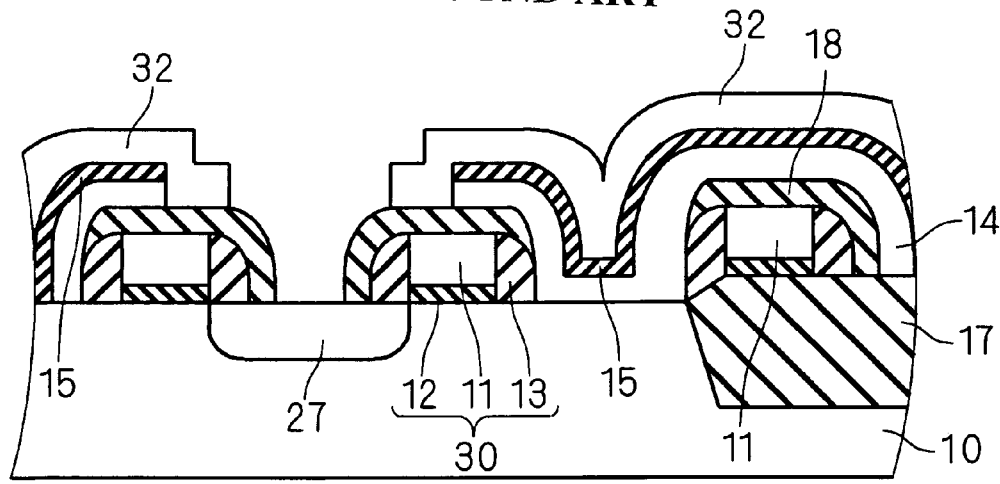
Figure 12:
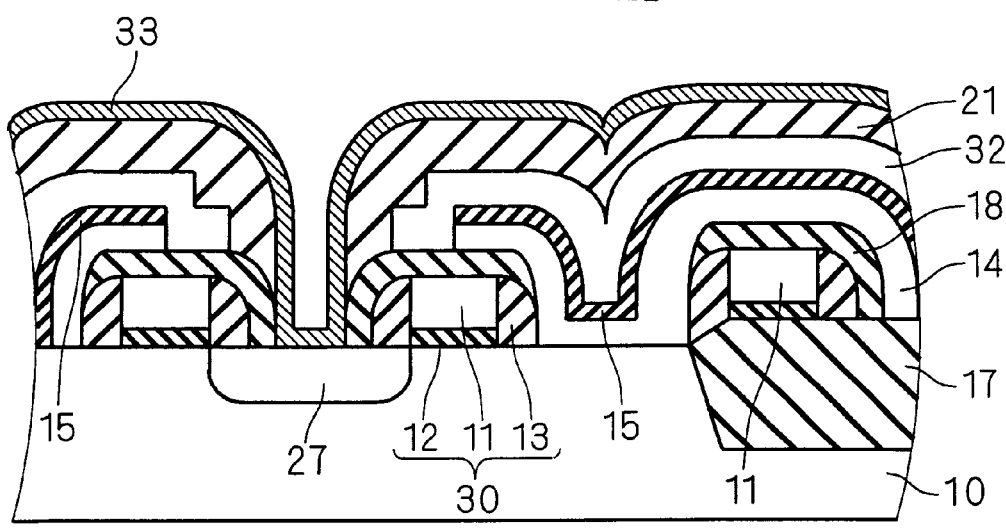

FIGS. 5 and 6 are cross-sectional views showing a method of manufacturing memory cells of the DRAM of the preferred embodiment shown in FIGS. 1 through 4.

As illustrated in FIG. 5, the MOS transistors 30 are selectively formed on the semiconductor substrate 10. Then, the upper surfaces of the gate electrodes 11 of the MOS transistors 30 are covered with the interlayer insulation film 18. Thereafter, the storage node 14 in contact with the second source/drain region 28 is selectively formed.

Next, as illustrated in FIG. 6, a nitride film is deposited on the storage node 14 and oxidized to form an oxynitride film which in turn is patterned to form the capacitor dielectric film 15. Doped polysilicon is deposited over the entire surface of the resultant structure and is then patterned (using a photolithographic technique or the like) so as to be left on the first source/drain region 27 and be divided on a bit line by bit line basis, to form the bit line cum cell plate 16.

Subsequently, an existing method is used to form the interlayer insulation films 22 to 24 and the first aluminum interconnect line 31. Thus, the structure shown in FIGS. 2 and 3 is provided.

As described hereinabove, the manufacture of the memory cell region according to the preferred embodiment of the present invention requires only three steps of wiring (forming conductive layers), i.e., the step of forming the gate electrodes 11 of the respective MOS transistors 30, the step of forming the storage node 14, and the step of forming the bit line cum cell plate 16.

Consequently, the preferred embodiment of the present invention requires a smaller number of wiring steps than the background art method, to achieve reduction in construction time and manufacturing costs.

While the invention has been described in detail, the foregoing description is in all aspects illustrative and not restrictive. It is understood that numerous other modifications and variations can be devised without departing from the scope of the invention.

What is claimed is:

1. A semiconductor memory comprising:
    a pair of bit lines; and
    a memory cell between said pair of bit lines,
    said memory cell comprising
        a memory cell capacitor having a first electrode and a second electrode, and
        a memory transistor having a first electrode connected to one of said pair of bit lines, a second electrode connected to said second electrode of said memory cell capacitor, and a control electrode connected to a select line,
    wherein said first electrode of said memory cell capacitor and the other of said pair of bit lines are integrally formed from a single interconnect layer, and wherein a region of said single interconnect layer serves as a bit line contact.

2. The semiconductor memory according to claim 1,
    wherein said control electrode of said memory transistor and said select line are integrally formed from a single interconnect layer.

3. The semiconductor memory according to claim 1,
    wherein said memory cell includes a plurality of memory cells formed in a region lying between said pair of bit lines, and said select line includes a plurality of select lines corresponding to said plurality of memory cells, respectively, said semiconductor memory further comprising
a sense amplifier circuit connected to said pair of bit lines for detecting and amplifying a potential difference between said pair of bit lines in a read operation.

4. The semiconductor memory according to claim 1, wherein said select line includes a first select line and a second select line;

wherein said memory cell includes a first memory cell and a second memory cell;

wherein a first memory transistor serving as said memory transistor of said first memory cell has a control electrode connected to said first select line, and a second memory transistor serving as said memory transistor of said second memory cell has a control electrode connected to said second select line; and wherein said first and second memory transistors have respective first electrodes connected commonly to said one of said pair of bit lines through a single bit line contact.

5. The semiconductor memory according to claim 4, wherein said control electrode of said first memory transistor and said first select line are integrally formed from a single interconnect layer, and said control electrode of said second memory transistor and said second select line are integrally formed from a single interconnect layer.

* * * * *